United States Patent [19]

Halpern

[11] Patent Number: 4,714,886

[45] Date of Patent: Dec. 22, 1987

[54] MAGNETIC RESONANCE ANALYSIS OF SUBSTANCES IN SAMPLES THAT INCLUDE DISSIPATIVE MATERIAL

[75] Inventor: Howard J. Halpern, Chicago, Ill.

[73] Assignee: President and Fellows of Harvard College, Cambridge, Mass.

[21] Appl. No.: 755,666

[22] Filed: Jul. 16, 1985

[51] Int. Cl.$^4$ .............................................. G01R 33/20
[52] U.S. Cl. .................................... 324/316; 324/318; 324/320
[58] Field of Search ............... 324/309, 316, 318, 319, 324/320, 317, 307; 335/299; 336/199, 122, 124, 126

[56] References Cited

U.S. PATENT DOCUMENTS

| | | | |
|---|---|---|---|
| 3,771,054 | 11/1973 | Hyde | 324/316 |
| 3,932,805 | 1/1976 | Abe et al. | 324/309 |
| 4,045,723 | 8/1977 | Ernst | 324/309 |
| 4,280,096 | 7/1981 | Karthe et al. | 324/309 |
| 4,390,840 | 6/1983 | Ganssen et al. | 324/309 |
| 4,422,042 | 12/1983 | Sugimoto | 324/319 |

OTHER PUBLICATIONS

Kramer, "Imaging of Elements other than Hydrogen", In: *Nuclear Magnetic Resonance Imaging in Medicine*, (Tokyo, Igaku-Shoin, 1982), pp. 184–189 & 196–197.
Berliner and Fujii, "Magnetic Resonance Imaging of Biological Specimens by Electron Paramagnetic Resonance of Nitroxide Spin Labels", *Science*, 227: 517–519, 1985.
Hoult et al., "Electromagnet for Nuclear Magnetic Resonance Imaging", Rev. Sci. Instrum., vol. 52, No. 9, Sep. 1981, pp. 1342–1351.
Romeo et al., "Magnetic Field Profiling: Analysis and Correcting Coil Design", Magnetic Resonance in Medicine, I, 1984, pp. 44–65.
Hutchison, J. M. S. and Mallard, J. R., "Electron Spin Resonance Spectrometry on the Whole Mouse in Vivo: a 100 MHz Spectrometer", Sep. 2, 1970, pp. 237–239, *Journal of Physics E:* 1971, vol. 4.
Fric, C. & Decorps, M., "Un Spectrometre Basse Frequence a Haute Sensibilite Pour L'etude de la Resonance des Spins Electroniques", *Journal of Physics E: Scientific Instruments*, 1972, vol. 5, pp. 337–342.

*Primary Examiner*—Stewart J. Levy
*Assistant Examiner*—Kevin D. O'Shea

[57] ABSTRACT

Magnetic resonance images of the distribution of a substance within a sample are obtained by splaying a pair of magnetic field generating coils relative to each other to generate a magnetic field gradient along an axis of the sample. In other aspects, electron spin resonance data is derived from animal tissue, or images are derived from a sample that includes dissipative material, using a radio frequency signal of sufficiently low frequency.

23 Claims, 8 Drawing Figures

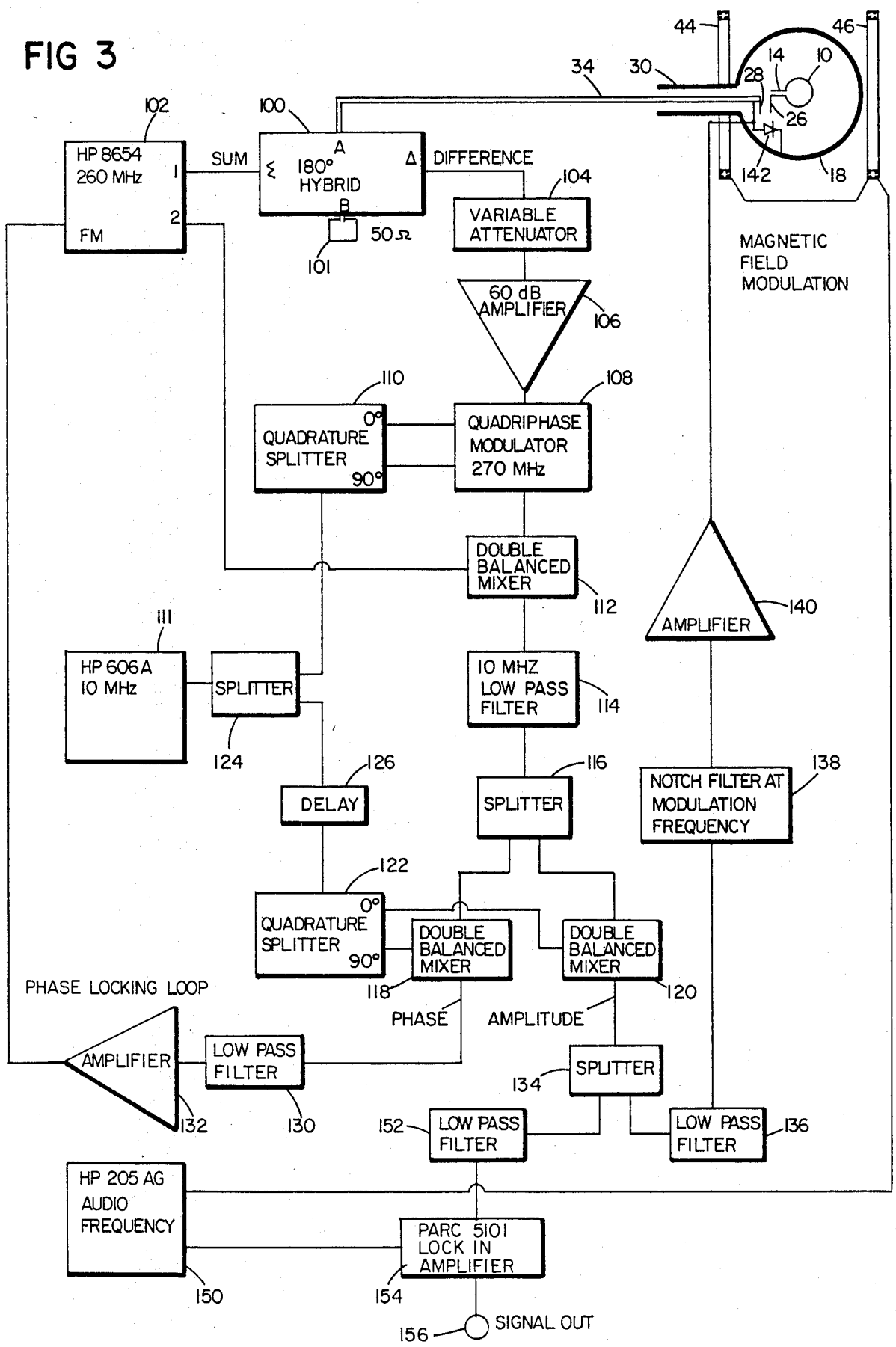

MAGNETIC RESONANCE ANALYSIS OF SUBSTANCES IN SAMPLES THAT INCLUDE DISSIPATIVE MATERIAL

BACKGROUND OF THE INVENTION

This invention relates to using magnetic resonance techniques, especially electron spin resonance (ESR), to analyze substances in samples of the kind that include dissipative material, for example, animal tissue.

ESR has been used spectroscopically to determine the presence and concentration of particular substances in a sample under analysis. Typically a very small sample is subjected to a fixed radio frequency field in the so-called X band (e.g., 9.5 Gigahertz) and to a time-varying homogenous magnetic field. The resulting absorption spectrum is detected as an indication of the presence and concentration within the sample of substances whose electron spin resonances correspond to magnetic field intensities that fall within the detected spectrum for the particular fixed radio frequency being used. Typically the magnetic field is on the order of several thousand gauss and is provided by placing the sample between the poles of an electromagnet. The time variation in the magnetic field is accomplished by varying the current in a pair of sweep coils positioned respectively between each pole of the electromagnet and the sample.

SUMMARY OF THE INVENTION

One general feature of the invention is in deriving data representative of an image of the distribution of a substance within a sample by establishing a magnetic field within the sample using a pair of coils that are positioned respectively on opposite sides of the sample and are splayed relative to each other to generate a magnetic field gradient along an axis of the sample, stimulating magnetic resonance within the sample to produce a magnetic resonance signal indicative of the distribution of the predetermined substance, and detecting the resonance signal and deriving the data representative of the image from the resonance signal.

Preferred embodiments include the following features. The coils are arranged in a Helmholtz configuration, and have centers that lie on a common axis that runs between them and intersects the sample, and the coils, when splayed, are oriented with respect to that axis at angles that have the same magnitude, but opposite orientations. The centers of the coils both lie on a circle that lies in a plane which is perpendicular to both of the planes in which the coils lie, and each coil plane is tangent to the circle at the point on the coil plane where the center of the coil lies. The radius of the splaying circle is half the radius of the coil. An additional gradient is imparted to the magnetic field by delivering different current levels to the respective coils, the additional gradient being along an axis that is at an angle (e.g., normal) to the axis of the magnetic field gradient established by splaying of the coils. The angle of splaying is updated through a sequence of steps from a minimum angle to a maximum angle corresponding to a maximum level of magnetic field gradient, the different current levels are caused to differ by succeedingly greater amounts corresponding to the splaying angles, and the magnitudes of the current levels are swept for each combination of splaying angle and current level difference. There are means for rendering the sample sensitive to resonance in only a single selected cross-sectional slice of the sample, e.g., two conductie loops surrounding the coils and powered by currents that are respectively oppositely directed and at different levels.

Another general feature of the invention is in deriving data representative of the existence of a predetermined substance within a sample of animal tissue by establishing a magnetic field within the sample, applying radio frequency energy to the sample, while the magnetic field is established, at a frequency sufficiently low to penetrate to all locations within the animal tissue to produce an electron spin resonance signal indicative of the existence of the predetermined substance, and detecting the electron spin resonance signal and deriving the data from the signal.

A third general feature of the invention is in deriving data representative of an image of a sample of a kind that includes dissipative material, using a frequency sufficiently low to penetrate to all locations within the sample, and detecting the signal and deriving from the signal the data representative of the image.

Preferred embodiments include the following features. The frequency is lower than 1 gigahertz, e.g., 260 megahertz. The sample is living tissue. The predetermined substance is oxygen.

By splaying the coils, a linear magnetic field gradient can be easily established along an axis that is offset from the axis between the coils. As a result, two-dimensional images can be accomplished with a single pair of coils. Using a low frequency radio frequency signal to stimulate resonance allows the signal to penetrate living tissue, notwithstanding its substantial aqueous content, and permits the use of low gauss magnetic structures, thus simplifying the apparatus.

Other advantages and features will become apparent from the following description of the preferred embodiment, and from the claims.

DESCRIPTION OF THE PREFERRED EMBODIMENT

We first briefly describe the drawings.

Drawings

FIG. 3 is a diagram of circuitry associated with the apparatus of FIG. 1.

Figure 8:
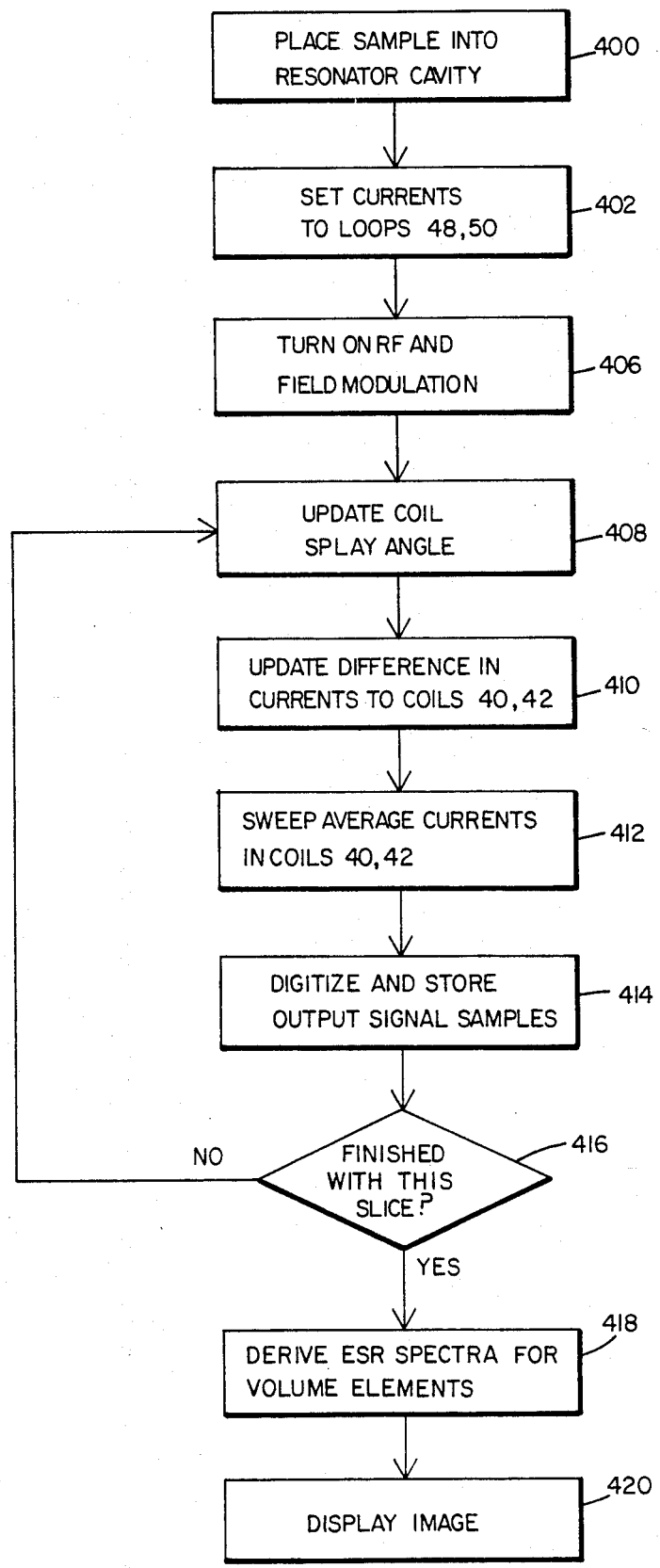

FIG. 8 a flow chart of the process of generating a sample image.

STRUCTURE AND USE

Figure 1:
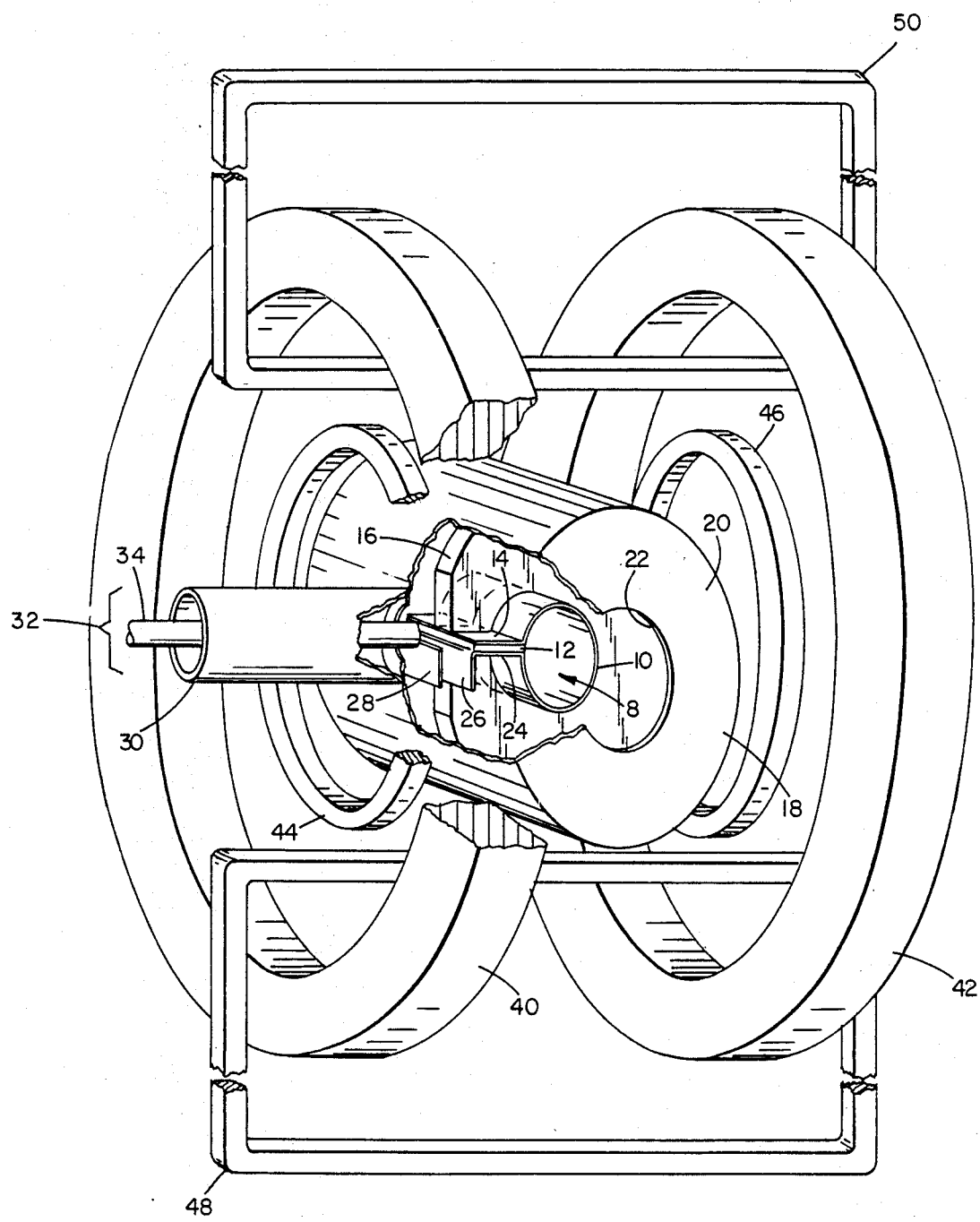
FIG. 1 is a schematic isometric view, partially cut away, of a resonator cavity and associated coils and apparatus.
Figure 2:
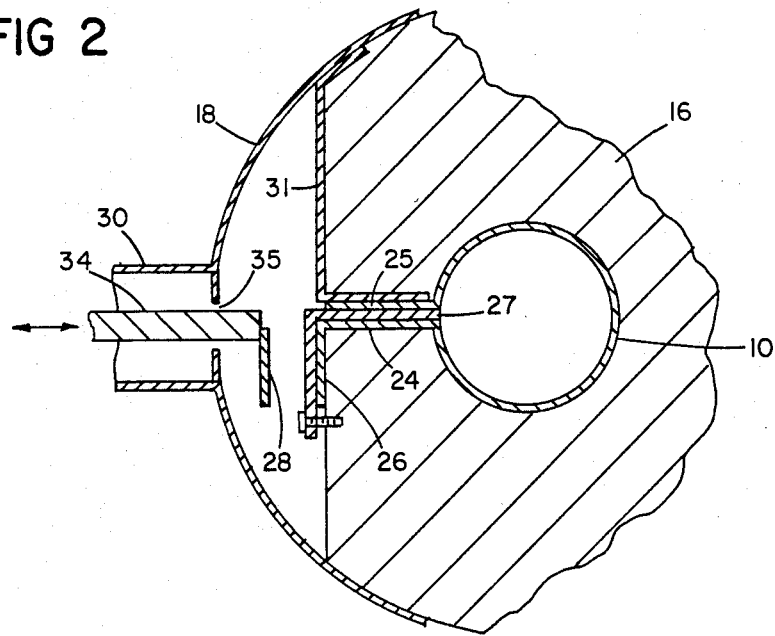
FIG. 2 is a cross-sectional view, partially cut away, at 2—2 of FIG. 1.

Referring to FIGS. 1, 2, a limb of a live mouse (not shown) with tumorous tissue (that is to be analyzed to produce images of the oxygen concentration in an array of small volumes—e.g., $\frac{1}{8}$ cc each—of the tumorous tissue) is placed within a resonator cavity 8 of a stripline design similar to one described in DeCorps & Fric, "Un spectrometre basse frequence a haute sensibilite pour l'etude de la resonance des spins electroniques," Journal de Physique E 5:337, 1972. Resonator cavity 8 includes a single, hollow, open-ended cylinder 10 machined from a block of high puity copper. Cylinder 10 is 1.126" long, 0.508" in radius, with a 1/16" wall thickness, and has a slit 12 running along the length of the cylinder on one side. Two plates of a single narrow gap (0.010") capacitor 14 are respectively connected to the two edges of cylinder 10 that define the slit 12. Cylinder 10 and capacitor 14 thus form a parallel L-C resonance circuit. This provides a homogeneous magnetic field within cylinder 10 and removes from within the cylinder the bulk of the electric field in the L-C system, thus minimizing the degrading effect of the dielectric aqueous tissue of the mouse tumor on the quality factor (Q) of the resonator. The resonator cavity (comprising cylinder 10, plates 24, 25 and sheet 27) is tightly fitted within a $\frac{1}{8}$" D-shaped clear acrylic spacer 16 that itself is held snugly within a 1.8" diameter radio frequency shielding cylinder 18. One end of cylinder 18 has a cap 20 (FIG. 1) with a 0.75" radius access hole 22 for permitting insertion of the mouse into cylinder 10. The other end of cylinder 18 (not shown in FIG. 1) is fully capped.

The bottom plate 24 of capacitor 14 is bent at a right angle onto the flat surface of spacer 16 to form a surface 26 (0.5"×1.26") that faces a single 1/16" thick copper plate 28 of equal size. Sheet 27 is bent to form a tab 29 that covers and protects plate 26. Tab 29 is screwed into spacer 16. Connection is made to the shielding cylinder 18 by the rigid outer metallic sheath 30 of a shielded cable 32. A center conductor 34 of cable 32 passes through a clearance hole 35 in cylinder 18 and its end is connected to and supports plate 28. The L-C circuit of cylinder 10 and capacitor 14 is thus capacitively coupled, by the capacitor formed by plates 26, 28, to a radio frequency power signal that is delivered via conductor 34.

Conductor 34 can be moved axially in and out (as indicated by the arrows in FIG. 2) to adjust the spacing between plates 26, 28 in order to roughly match the impedance of the resonator cavity structure to the impedance of a circuit that delivers the radio frequency power signal.

Plate 25 of capacitor 14 is connected by a copper tape 31 (FIG. 2) to cylinder 18, which is grounded. Tape 31 is pressed between the upper surface of plate 25 and spacer 16 and extends along the flat surface of spacer 16 to cylinder 18 where its other end is held between spacer 16 and cylinder 18. The capacitor formed by plate 28 and the shielding cylinder 18, and the capacitor formed by plates 26, 28 are connected in series, to form a capacitor divider, to match impedances and cause a step-up of voltage from conductor 34 to plate 26, represented by the ratio of the two capacitances. Fine adjustment of the capacitance ratio (and hence the impedance match) is provided by an electronically controlled varactor diode (FIG. 3) connected between conductor 34 and shield 18. The impedance matching being solely capacitive is independent of phase variation effects.

Figure 6:
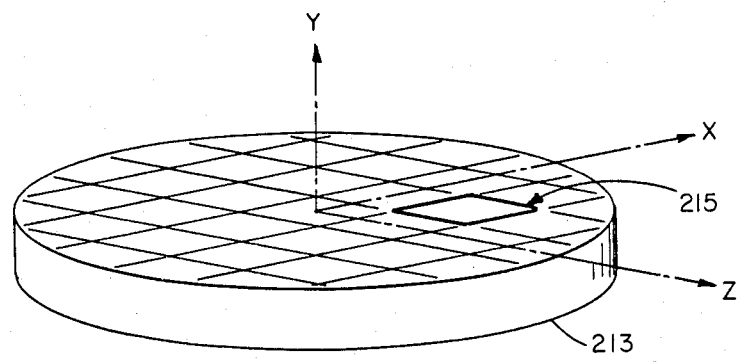
FIG. 6 shows a representatiave slice of a sample.

A magnetic field of approximately 93 gauss is imposed on the sample by a pair of ring-shaped Helmholtz coils 40, 42, each 0.3 meters in diameter, that are powered by 6 amperes at 35 volts from an appropriate power supply 220 (Kepco ATE 75-15) (FIG. 6). Coils 40, 42 are each wound of 400 turns of #10 copper wire. The magnetic field produced by the coils is homogeneous to 1 part in $10^4$ across the space within cylinder 10. The magnetic field of coils 40, 42 is modulated at an audio frequency by a smaller diameter pair of parallel, Helmholtz coils 44, 46, each 0.14 meters in diameter. Each coil 44, 46 is wound of 184 turns of #10 copper wire. Coils 44, 46 are connected in series and driven in a manner to be described below.

The two coils 40, 42 are surrounded by a pair of rectangular loop conductors 48, 50 respectively above and below shield 18. The two loops 48, 50 are respectively caused to carry two different oppositely directed oscillating currents at a frequency different from that of the frequency used in coils 44, 46 to modulate the magnetic field. The effect of this is to make the system sensitive to resonances only within a selected horizontal plane of the sample within cylinder 10, thus permitting analysis of successive horizontal slices in the sample, as discussed in Henshaw, Morre, et al., J. Appl. Phys. 47: 3709 (1976).

Referring to FIG. 3, conductor 34 is connected via the A input of a 180° hybrid splitter 100 (Olektron O-H-30V-1) and then via the sum terminal of splitter 100 to one output of a frequency modulatable signal generator 102 (Hewlett-Packard HP-8654A). A dummy 50 ohm finely adjusted impedance 101 is connected to the B terminal of hybrid 100. Radio frequency power at 260 megahertz is delivered via conductor 34 to cavity 8 and also to dummy 101, and any reflected power signal from cavity 8 is returned via conductor 34. The signals reflected from cavity 8 and from dummy 101 cancel unless an imbalance caused by ESR absorption or dispersion changes the cavity impedance. The difference terminal of hybrid 100 delivers a signal representative of the difference between the impendance of the dummy (50.0 ohms) and that of cavity 8 (transformed by the capacitance divider). That difference signal passes via a variable attenuator 104 to a 60 dB amplifier 106 (Trontech model #W500ef) having a 1.5 dB noise figure. The difference signal is demodulated in three stages to derive a signal representative of the ESR spectrum of the sample.

The first demodulation stage removes the 260 megahertz carrier and transfers the ESR spectral information in the difference signal to a 10 megahertz carrier signal. This is done in a quadriphase modulator 108 (Olektron 0-JPM-240) arranged as a signal sideband modulator. A quadrature splitter 110 delivers quadrature components of a 10 megahertz power signal (delivered from a signal generator 111—Hewlett Packard HP 606A) to modulator 108 to step up the difference signal from 260 to 270 megahertz. The output of modulator 108 is mixed in a double balanced mixer 112 (Olektron 3002/A) with a second 260 megahertz signal (from generator 102) that is frequency modulated in the same fashion as the original power signal (i.e., is a branch from the same frequency source). The result is then filtered in a low pass Chebyshev filter 114 to produce the 10 megahertz carrier on which the ESR spectral information is superimposed.

In the second demodulation stage, the 10 megahertz signal is split in a splitter 116. It is then combined in two identical double balanced mixers 118, 120 (Minicircuits ZAD-1) respectively with delayed in-phase and quadrature versions of the same 10 megahertz signal provided from generator 111 to splitter 110. Both 10 megahertz signals are delivered by a splitter 124. The quadrature versions are generated in quadrature splitter 122 based on one of the 10 megahertz signals that has been delayed in a delay element 126. Mixer 118 then delivers one signal that is proportional to the imaginary part (phase) of the signal reflected from the cavity and mixer 120 delivers a second signal proportional to the real part (amplitude) of the signal reflected from the cavity. The phase signal is then passed through a low pass filter 130 and a 741 operational amplifier 132 for feedback to the frequency modulation (FM) input of generator 102 in order to frequency lock generator 102 to the frequency of the cavity signal.

The cavity amplitude signal is split in a splitter 134. One branch of the split signal is used to adjust the impedance of the cavity resonator system to match it to the impedance of the RF power delivery circuitry. That branch is fed via a low pass filter 136 and an LC notch filter 138 adjusted to the modulation frequency (10 megahertz), to desensitize it to changes in the cavity resistance that are due to ESR absorption at the frequency of the magnetic field modulation. The output of the notch filter is passed via a unipolar operational amplifier 140, whose output controls a varactor diode 142. The varactor diode adjusts for changes in the cavity impedance caused by microphonic noise, animal movement, and the like. Both this amplitude sensitive feedback and the feedback of the phase signal to generator 102 stabilize the system against animal motion.

In the third demodulation stage, the audio frequency (e.g., 200 hertz) modulation of the magnetic field (imposed on coils 44, 46 by an audio frequency generator 150 (Hewlett-Packard HP 205 AG) is demodulated by passing the second branch of the amplitude signal via a low pass R-C filter 152 to a lock-in amplifier 154 (Princeton Applied Research Company PARC 5101). The other input of amplifier 154 receives from generator 150 the same signal that was used to modulate the magnetic field.

The output signal 156 represents the spectrum of the ESR cavity signal as a function both of magnetic field intensity at the center of the sample and of magnetic field gradients that are imposed in a manner to be described below. The output signal can then be analyzed to determine the concentration of paramagnetic material in the sample, or of substances to which the ESR spectra are sensitive, most notably oxygen.

Figure 4:
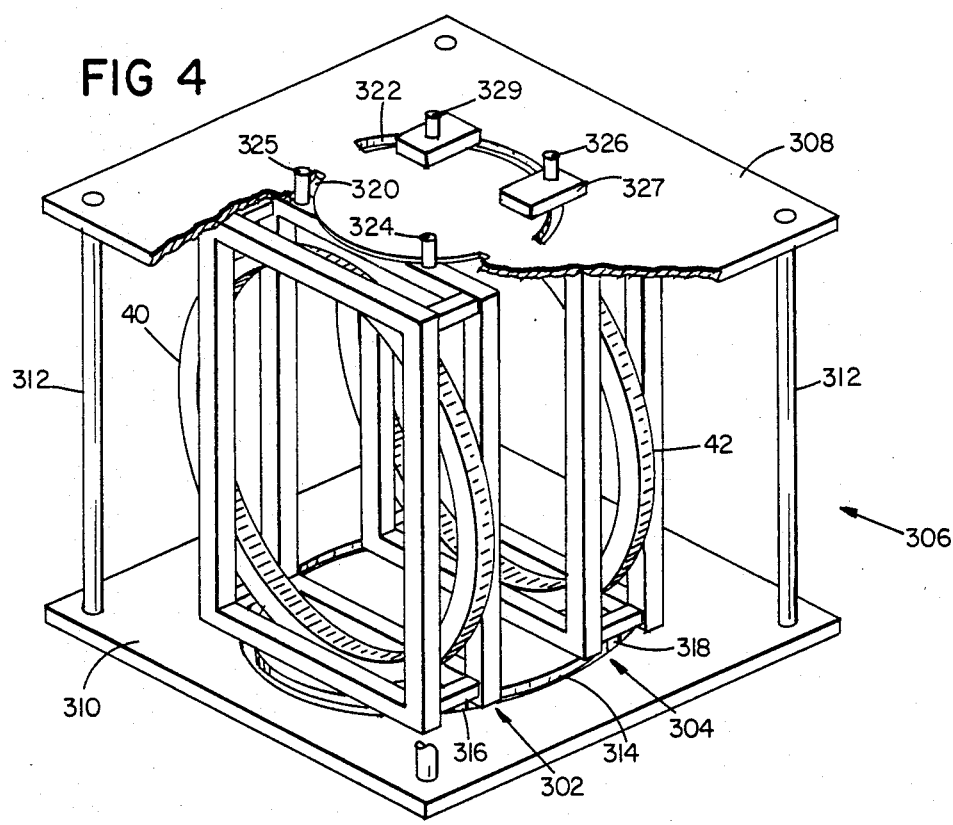
FIG. 4 is an isometric view, partially cut away, of a housing for the large Helmholtz coils of FIG. 1.

Referring to FIG. 4, coils 40, 42 are respectively housed in two rectangular box frames 302, 304 and frames 302, 304 are both held in a housing 306 consisting of a pair of parallel aluminum plates 308, 310 each $17 \times 17 \times \frac{1}{2}$ inches held together by four upright posts 312. The upper face of plate 310 is milled with a circular groove 314 that is semicircular in cross-section. Each frame 302, 304 has a pair of bearings 316, 318 (only two shown) mounted on opposite ends of the bottom of the frame which ride in groove 314. A pair of semicircular slots 320, 322 are cut into the top plate 308. Frames 302, 304 are mounted with vertical rods 324, 325, 326, 329 that project through and are guided along slots 320, 322, respectively. On each rod 324, 325, 326, 329 is mounted a ball-bearing triplet, e.g. 327, that rides on the top surface of plate 308. Slots 320, 322 are centered on a point which lies directly above the center of the circle defined by groove 314. Circle 314, slots 320, 320, and the points at which bearings 316, 318 and rods 324, 325, 326, 329 are mounted on frames 302, 304 are located such that the midplanes of both frames can be rotated about a circle of radius $\frac{1}{2}$ the radius of each coil, with the planes of the coils remaining tangent to the circle.

Figure 5:
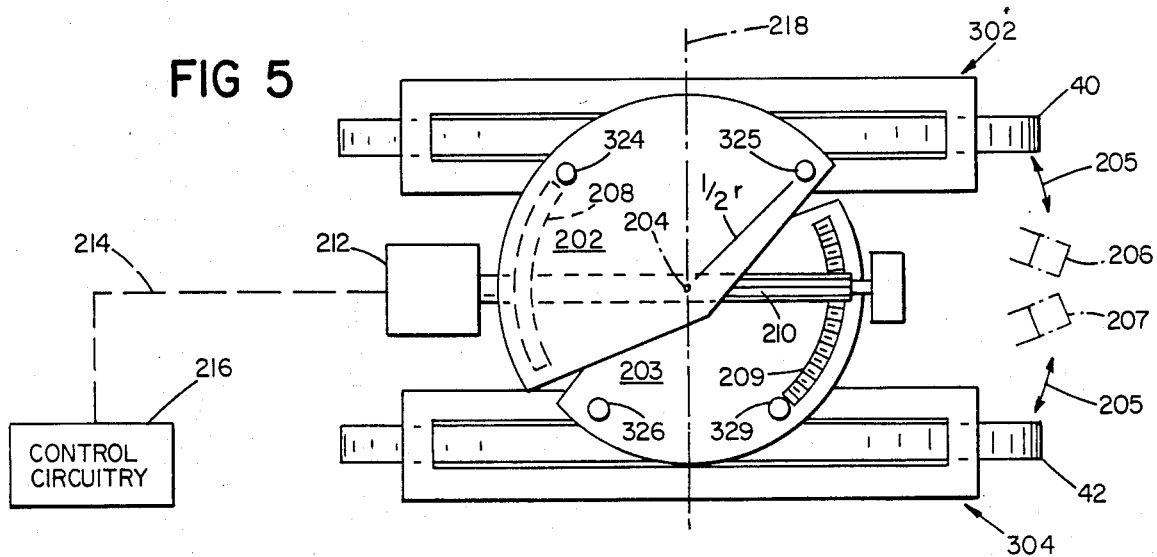
FIG. 5 is a top view of the splaying drive mechanism for the large Helmholtz coils.

Referring to FIG. 5, the tops of rods 324, 325, 326, 329 are respectively housed in a pair of turntables 202, 203 that are mounted above top plate 308 and are arranged to rotate in opposite directions around a central axis 204 such that when turntables 202, 203 rotate around axis 204, coils 40, 42 also rotate around axis 204 (as suggested by arrows 205). As turntables 202, 203 rotate, coils 40, 42 become splayed relative to one another. The splaying can be increased by rotation of turntables 202, 203 until (at a maximum position shown in dashed lines 206, 207) coil 40 bumps coil 42. Turntables 202, 203 have radii of $(\frac{1}{2})r$ where r is the radius of each coil 40, 42. Turntable 202 bears a semi-cylindrical rack 208 on its under surface. Turntable 203 bears a similar rack 209 on its upper surface. Racks 208, 209 cooperate with a long pinion 210 driven by a stepping motor 212 which is mounted on plate 308 in a fixed position relative to turntables 202, 203. Stepping motor 212 is connected by a line 214 to control circuitry 216 which delivers stepping motor pulses to cause turntables 202, 203 to rotate about axis 204 in a sequence of small steps to also any desired locations.

Referring to FIG. 6, splaying of coils 40, 42 imparts to the magnetic field imposed on the sample a gradient along an axis (the X axis in FIG. 6) that is horizontal and normal to the axis (the Z axis in FIG. 6) 218 between the centers of the coils. That gradient is linear with displacement (x) from axis 218 to order of $(x/r)^4$. In FIG. 6, the Y axis represents the vertical location of each horizontal slice of the sample (e.g., the slice 213 shown in FIG. 6). Placing motor 212 above plate 308 aids in shielding electrical noise generated by the motor from the resonator cavity.

Figure 7:
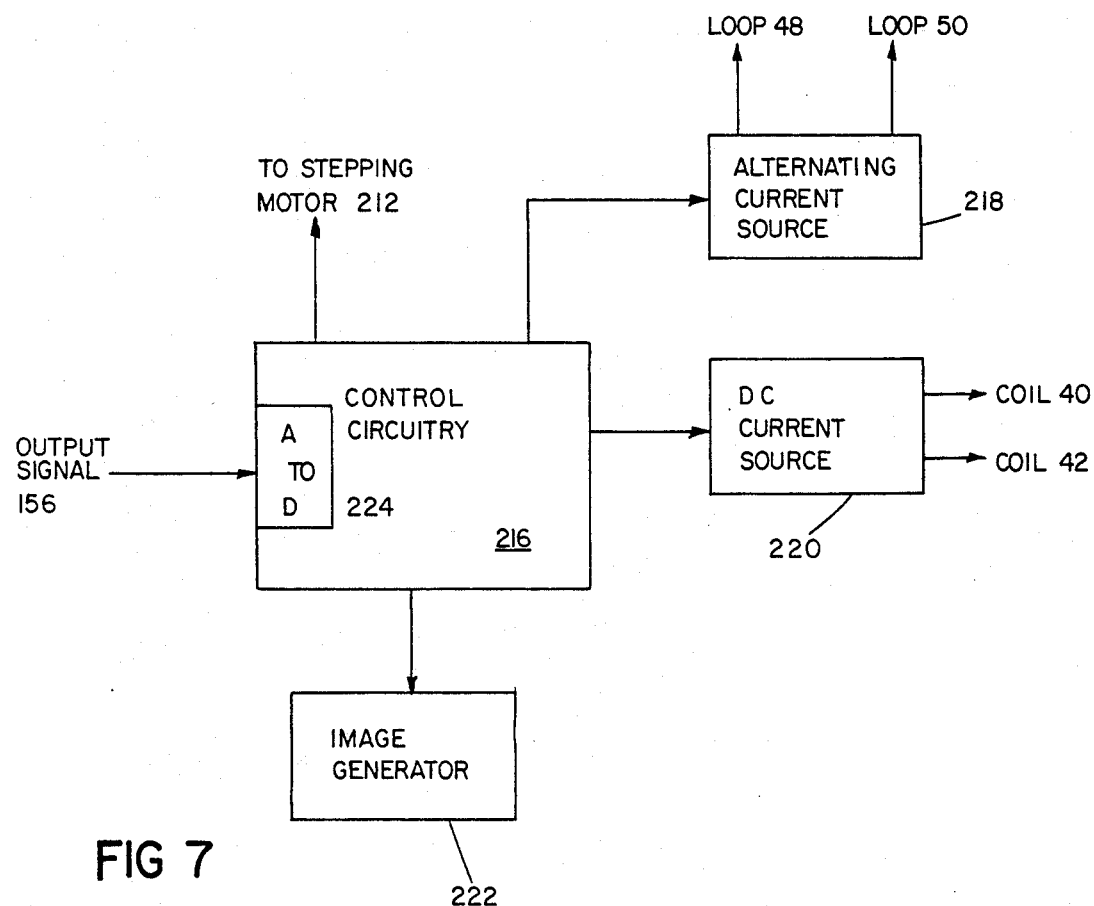
FIG. 7 is a block diagram of control circuitry.

Referring to FIG. 7, control cicuitry 216, in addition to being connected to deliver pulses to stepping motor 212, is connected to provide control signals to an alternating current source 218 which supplies currents respectively to loops 48, 50, at a frequency different from the audio frequency at which the magnetic field is modulated. The currents to loops 48, 50 are oppositely directed and are at different levels. Loops 48, 50 thus define a selected sensitive horizontal slice through the sample such that, with operation of the feedback system of the circuitry of FIG. 3, any portion of the cavity signal related to portions of the sample outside of the horizontal slice are eliminated. By adjusting the relative levels of the currents to loops 48, 50, the vertical location of the sensitive slice can be altered. By adjusting the absolute levels of those currents, the thickness of the slice can be varied. The control signals provided from control circuitry 216 to source 218 specify the levels of the two currents, thus specifying the location and thickness of the sensitive slice.

Control circuitry 216 is also connected to provide signals to a DC current source 220 to provide DC currents to coils 40, 42 at two different levels to impose on the magnetic field a gradient along the axis between the centers of the two coils and to control the magnitude of the gradient.

Control circuitry 216 also includes an A-to-D converter 224 that receives the analog output signal 156, and digitizes it for storage and processing.

Finally, control circuitry 222 is connected to an image generation device such as a printer or cathode ray tube, for displaying a two-dimensional image of the distribution of paramagnetic material concentration in each horizontal slice of the sample, or specifically the distribution of oxygen concentration which can be devised from spectra in the manner described in Lai, et al., "ESR studies of $O_2$ uptake by Chinese hamster ovary cells during the cell cycle," Proceedings Nat'l Acad. Sci. USA Vol. 79:1166–1170, 1982, incorporated herein by reference.

Control circuitry 216 is a microprocessor (with digital storage) programmed to control the generation of images in the following manner.

Referring to FIG. 8, the mouse limb is placed (400) into cylinder 10. To generate an image of a single horizontal slice, signals are sent (402) to current source 218 to set the current in loops 48, 50 to the values that will define that horizontal slice to be the sensitive portion of the sample. Next the circuit of FIG. 3 is turned on (406) to provide the RF power signal over conductor 34, to modulate the magnetic field, and to deliver the resulting output signal 156. The RF power signal is delivered continuously rather than in pulses. Next stepping pulses are sent to motor 212 to cause coils 40, 42 to move (408) to a new splay angle and the difference in the currents being delivered to coils 40, 42 is updated to a new value (410) thus establishing two magnetic field gradients, one a steep gradient along the axis between the center of the coils 40, 42, the other a mild gradient at an angle to that axis. Next, currents in the two coils 40, 42 are increased while maintaining the same difference between them, so that the average magnetic field value is swept through the limits of the magnetic field variation imposed by the gradients. While the currents are being swept, the output signal is digitized and the resulting samples are stored (414). If the maximum splaying angle (corresponding to maximum field gradient $G_{max}$) has not been reached (416), the coil splay angle is increased incrementally (408) and steps 410, 412, 414 are repeated. The process is repeated until the maximum field gradient $G_{max}$ is reached.

The stored digital samples are then analyzed mathematically to derive the ESR spectrum applicable to each volume element in the slice (e.g., element 215 in FIG. 6). The ESR spectra are then analyzed in a conventional way (e.g., by Fourier analysis to identify spikes corresponding to the presence of oxygen, in the present example, or by a least squares fitting technique) to determine the concentration in each volume element of the slice. The resulting concentration values are then organized into a matrix for display, e.g., in the form of a topographic image of concentration in the slice. The same process is repeated for each other slice in the sample which may be of interest. A three-dimensional image of the concentration in the sample can then be derived and displayed.

Other embodiments are within the following claims.

Samples other than animal tissue may be analyzed for a variety of predetermined substances other than oxygen.

The coil splaying may begin at a negative angle (rather than at 0) and be stepped to 0 or to a positive angle.

The RF power can be delivered at frequencies other than 260 megahertz, preferably lower than 1 gigahertz, and in any case low enough to penetrate to all parts of the sample even though it may contain dissipative material.

I claim:

1. Magnetic resonance apparatus for deriving data representative of an image of the distribution of a predetermined substance within a sample, comprising
    means for establishing a magnetic field within said sample,
    means for stimulating magnetic resonance within said sample to produce a magnetic resonance signal indicative of said distribution of said predetermined substance, and
    means for detecting said resonance signal and deriving said data representative of said image from said resonance signal,
    said means for establishing a magnetic field comprising a pair of coils that are positioned respectively on opposite sides of said sample and are splayed relative to each other to generate a magnetic field gradient along an axis of said sample, each said coil being substantially ring-shaped and lying substantially in a plane.

2. The apparatus of claim 1 wherein said coils are arranged in a Helmholtz configuration.

3. The apparatus of claim 1 wherein said coils have centers that lie on a common axis that runs between them, said axis intersecting said sample, said coils when splayed being oriented at angles to said axis that have the same magnitude, but opposite orientations.

4. The apparatus of claim 1 wherein said coils have centers that lie on a common axis that runs between them, and, when said coils are splayed, said centers both lie on a circle that lies in a plane which is perpendicular to both of the planes in which said coils lie, and each said coil plane is tangent to said circle at the point where said center of said coil lies.

5. The apparatus of claim 4 wherein the radius of said circle is half the radius of said coil.

6. The apparatus of claim 1 wherein
    said means for establishing a magnetic field further includes means for imparting an additional gradient to said magnetic field by delivering different current levels to the respective said coils, said additional gradient being along an axis that is at an angle to the axis of said magnetic field gradient established by splaying of said coils.

7. The apparatus of claim 6 wherein said axis of said additional gradient is normal to said axis of said magnetic field gradient established by splaying of said coils.

8. The apparatus of claim 6 further comprising
    a controller for causing the angle of said splaying to be updated through a sequence of steps from a minimum angle to a maximum angle corresponding to a maximum level of said magnetic field gradient, and for causing said different current levels to differ by succeedingly greater amounts corresponding to said splaying angles, and for causing the magnitudes of said current levels to be swept for each combination of splaying angle and current level difference.

9. The apparatus of claim 8 wherein said minimum angle is 0.

10. The apparatus of claim 1 further comprising means for rendering said sample sensitive to resonance in only a single selected cross-sectional slice of said sample.

11. The apparatus of claim 10 wherein said means for rendering comprises two conductive loops, etch loop surrounding both of said coils, and a power source for imposing in said two loops currents that are respectively oppositely directed and at different levels.

12. The apparatus of claim 1 wherein
    said means for stimulating comprises a radio frequency generator that produces a radio frequency signal having a frequency sufficiently low to penetrate to all locations within said sample.

13. The apparatus of claim 1 wherein said magnetic resonance comprises electron spin resonace.

14. Electron spin resonance apparatus for deriving data representative of an image of the distribution of a predetermined substance within a sample of a kind that includes dissipative material, said apparatus comprising means for establishing a magnetic field within said sample, means for stimulating electron spin resonance within said sample to produce an electron spin resonance signal indicative of said distribution of said predetermined substance, and means for detecting said electron spin resonance signal and for deriving said data representative of said image from said resonance signal, said means for stimulating comprising a radio frequency generator that produces a radio frequency signal for delivery to said sample, said radio frequency signal having a frequency lower than 1 gegahertz to penetrate to all locations within said sample.

15. The apparatus of claims 12 or 14 wherein said frequency is lower than 1 lgigahertz.

16. The apparatus of claims 14 or 15 wherein said frequency is 260 megahertz.

17. The apparatus of claims 1, 12, or 14 wherein said sample comprises living tissue.

18. The apparatus of claims 1, 12, or 14 wherein said predetermined substance comprises oxygen.

19. A magnetic resonance method for deriving data representative of an image of the distribution of a predetermined substance within a sample, said method comprising, establishing a magnetic field within sample using a pair of coils that are positioned respectively on opposite sides of said sample and are splayed relative to each other to generate a magnetic field gradient along an axis of said sample, each said coil being substantially ring-shaped and lying substantially in a plane, stimulating magnetic resonance within said sample to produce a magnetic resonance signal indicative of the distribution of said predetermined substance, and detecting said resonance signal and deriving said data representative of said image from said resonance signal.

20. An electron spin resonance method for deriving data representative of an image of the distribution of a predetermined substance within a sample of a kind that includes dissipative material, said method comprising:

establishing a magnetic field within said sample, applying radio frequency energy to said sample, while said magnetic field is established, at a frequency lower than 1 gegahertz to penetrate to all locations within said sample, to produce an electron spin resonance signal indicative of said distribution of said predetermined substance, and detecting said signal and deriving from said signal said data representative of said image.

21. The apparatus of claims 1, 12, or 14 wherein said means for stimulating resonance comprises a resonator for stimulaing said sample, an RF power delivery circuit coupled to said resonator, an adjustable element for adjusting the impedance of said resonator, and a circuit for controlling said element to match said resonator impedance to the impedance of said RF power delivery circuit to minimize the effects of motion of said sample.

22. The apparatus of claim 21 wherein said RF power delivery circuit is capacitively coupled to said resonator and said element comprises an electrically adjustable capacitance.

23. The apparatus of claim 22 wherein said element comprises a varactor diode.

* * * * *